(12) United States Patent
Song

(10) Patent No.: US 11,177,463 B2
(45) Date of Patent: Nov. 16, 2021

(54) ORGANIC LIGHT EMITTING DIODE DISPLAY DEVICE

(71) Applicant: Samsung Display Co., Ltd., Yongin-si (KR)

(72) Inventor: Jungbae Song, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/912,589

(22) Filed: Jun. 25, 2020

(65) Prior Publication Data

US 2020/0328383 A1 Oct. 15, 2020

Related U.S. Application Data

(63) Continuation of application No. 15/612,710, filed on Jun. 2, 2017, now Pat. No. 10,720,607.

(30) Foreign Application Priority Data

Feb. 2, 2017 (KR) ........................ 10-2017-0015085

(51) Int. Cl.
*H01L 51/52* (2006.01)
*H01L 27/32* (2006.01)
*H01L 51/50* (2006.01)

(52) U.S. Cl.
CPC ...... *H01L 51/5275* (2013.01); *H01L 51/5256* (2013.01); *H01L 51/5265* (2013.01);
(Continued)

(58) Field of Classification Search
CPC ............ H01L 51/5275; H01L 51/5265; H01L 51/5256; H01L 51/502; H01L 27/322; H01L 51/5284; H01L 2251/558
See application file for complete search history.

(56) References Cited

U.S. PATENT DOCUMENTS

| 8,154,197 B2 | 4/2012 | Jun et al. |
| 9,203,055 B2 | 12/2015 | Park et al. |

(Continued)

FOREIGN PATENT DOCUMENTS

| KR | 10-1996-7004335 | 8/1996 |
| KR | 10-2015-0069845 | 6/2015 |
| KR | 10-2015-0104263 | 9/2015 |

OTHER PUBLICATIONS

Non-Final Office Action dated Apr. 19, 2018 to U.S. Appl. No. 15/612,710.

(Continued)

*Primary Examiner* — Latanya N Crawford Eason
(74) *Attorney, Agent, or Firm* — H.C. Park & Associates, PLC

(57) ABSTRACT

An organic light emitting diode (OLED) display may include: an OLED configured to emit light of wavelength $\lambda$; an encapsulation layer encapsulating the OLED, the encapsulation layer including: a first inorganic layer disposed on the OLED, the first inorganic layer including: one or more first layers having a first refractive index ($n_1$) and a first thickness substantially equal to $\lambda/(4*n_1)$; and one or more second layers having a second refractive index ($n_2$) and a second thickness substantially equal to $\lambda/(4*n_2)$, wherein the second refractive index is smaller than the first refractive index, and wherein the one or more first layers and the one or more second layers are alternatingly stacked on one another.

29 Claims, 4 Drawing Sheets

(52) U.S. Cl.
CPC .......... *H01L 27/322* (2013.01); *H01L 51/502* (2013.01); *H01L 51/5284* (2013.01); *H01L 2251/558* (2013.01)

(56) References Cited

U.S. PATENT DOCUMENTS

| | | |
|---|---|---|
| 9,214,516 B2 | 12/2015 | Mine et al. |
| 2007/0200492 A1 | 8/2007 | Cok et al. |
| 2009/0302750 A1 | 12/2009 | Jun et al. |
| 2012/0242565 A1 | 9/2012 | Noh et al. |
| 2013/0168712 A1 | 7/2013 | Jeong et al. |
| 2014/0183492 A1 | 7/2014 | Park et al. |
| 2014/0306193 A1 | 10/2014 | Lee et al. |
| 2015/0048348 A1 | 2/2015 | Huang et al. |
| 2015/0171269 A1 | 6/2015 | Kim et al. |
| 2016/0093828 A1 | 3/2016 | Kim et al. |
| 2017/0090247 A1* | 3/2017 | Lee ........................ B82Y 30/00 |
| 2017/0315389 A1* | 11/2017 | Chu .................. G02F 1/133514 |
| 2017/0357125 A1 | 12/2017 | Tojo |
| 2018/0040847 A1 | 2/2018 | Lee |
| 2018/0047800 A1 | 2/2018 | Choi et al. |
| 2018/0210280 A1* | 7/2018 | Chen ........................ H01L 27/32 |

OTHER PUBLICATIONS

Final Office Action dated Nov. 30, 2018 to U.S. Appl. No. 15/612,710.
Non-Final Office Action dated Apr. 16, 2019 to U.S. Appl. No. 15/612,710.
Final Office Action dated Oct. 21, 2019 to U.S. Appl. No. 15/612,710.
Final Office Action dated Jan. 10, 2020 to U.S. Appl. No. 15/612,710.
Notice of Allowance dated Mar. 23, 2020 to U.S. Appl. No. 15/612,710.

\* cited by examiner

ORGANIC LIGHT EMITTING DIODE DISPLAY DEVICE

CROSS-REFERENCE TO RELATED APPLICATION

This application is a continuation of U.S. patent application Ser. No. 15/612,710, filed on Jun. 2, 2017, which claims priority from and the benefit of Korean Patent Application No. 10-2017-0015085, filed on Feb. 2, 2017, which is hereby incorporated by reference for all purposes as if fully set forth herein.

BACKGROUND

Field

The invention generally relates to a display device, more specifically, to a display device including an organic light emitting diode (OLED) display with improved light emitting characteristics.

Discussion of the Background

Display devices are devices that configured to display image, and recently, the organic light emitting diode (OLED) has been widely used as display element.

The OLEDs included in the OLED display devices are self-illuminating, compared to liquid crystal display devices, which require an additional light source, so the OLED display devices may have reduced thickness and weight. Also, the OLED display devices have wide viewing angle, enhanced contrast, and improved response time.

OLEDs are sensitive and require protection from outside elements, such as oxygen and humidity. Encapsulation of the LED protects against such elements, but can interfere with the operation of the device, including decreasing optical efficiency. Accordingly, there is a need for OLEDs are protected from harmful contaminants but also have increased optical efficiency.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments constructed according to the principles of the invention provide a display device including an organic light emitting diode (OLED) having protection against harmful contaminant and improved optical efficiency. In particular, exemplary embodiments can improve optical efficiency of OLEDs by controlling the thickness of the encapsulation layer depending upon properties such as the index of refraction.

Additional aspects will be set forth in the detailed description which follows, and, in part, will be apparent from the disclosure, or may be learned by practice of the inventive concept.

According to one aspect of the invention, an organic light emitting diode (OLED) display may include: an OLED configured to emit light of wavelength $\lambda$; and an encapsulation layer encapsulating the OLED, the encapsulation layer including: a first inorganic layer disposed on the OLED, the first inorganic layer including: one or more first layers having a first refractive index ($n_1$) and a first thickness substantially equal to $\lambda/(4*n_1)$; and one or more second layers having a second refractive index ($n_2$) and a second thickness substantially equal to $\lambda/(4*n_2)$, wherein the second refractive index is smaller than the first refractive index, and wherein the one or more first layers and the one or more second layers are alternatingly stacked on one another.

The OLED may include: a substrate; a first electrode disposed on the substrate; an intermediate layer to generate the light disposed on the first electrode; and a second electrode disposed on the intermediate layer.

The at least one of the one or more first layers may be disposed directly on the OLED.

The first inorganic layer may further include: one or more third layers having a third refractive index ($n_3$) and a third thickness substantially equal to $\lambda/(4*n_3)$, wherein the third refractive index is greater than the second refractive index.

The one or more first layers may include silicon nitride or silicon oxynitride; the one or more second layers may include silicon oxide; and the one or more third layers may include silicon oxynitride.

The encapsulation layer may further include: an organic layer disposed on the first inorganic layer; a second inorganic layer disposed on the organic layer.

The wavelength $\lambda$ of light emitted by the OLED may be monochromatic.

The wavelength $\lambda$ of light emitted by the OLED may be within the blue spectrum.

The OLED display may further include: a color conversion layer disposed on the second inorganic layer, the color conversion layer including: a plurality of red quantum dots to convert blue light to red light; and a plurality of green quantum dots to convert blue light to green light; and a color filter layer disposed on the color conversion layer.

The OLED may include a lithium fluoride layer

According to one aspect of the invention, an organic light emitting diode (OLED) display may include: a substrate: an OLED disposed on the substrate, the OLED configured to generate a light; and an encapsulation layer disposed on the OLED sealing the OLED, the encapsulation layer including: a first inorganic layer disposed on the OLED, the first inorganic layer including: one or more first layers having a first refractive index; and one or more second layers having a second refractive index, the second refractive index being smaller than the first refractive index, wherein one of the one or more first layers of the first inorganic layer is disposed directly on the OLED.

The one or more first layer and the one or more second layer may be disposed alternatingly stacked on one another.

Each first layer may have a first thickness substantially equal to $\lambda/4\ n_1$, wherein each second layer has a second thickness substantially equal to $\lambda/4\ n_2$, and wherein $n_1$ represents the first refractive index, $n_2$ represents the second refractive index, and $\lambda$ represents a wavelength of light emitted by the OLED.

The OLED may include: a first electrode disposed on the substrate; an intermediate layer disposed on the first electrode to generate t light; and a second electrode disposed on the intermediate layer.

The first inorganic layer may further include: a third layer having a third refractive index greater than the second refractive index.

The third layer has a third thickness substantially equal to $\lambda/4\ n_3$, $n_3$ representing the third refractive index and $\lambda$ representing a wavelength of light emitted by the OLED.

The one or more first layers may include silicon nitride or silicon oxynitride; wherein the one or more second layers may include silicon oxide; and the one or more third layers may include silicon oxynitride.

A wavelength of the light emitted by the OLED may be within the blue spectrum.

According to one aspect of the invention, an organic light emitting diode (OLED) display may include: an OLED configured to emit light of wavelength λ; an encapsulation layer encapsulating the OLED, the encapsulation layer including: a first inorganic layer disposed on the OLED, the first inorganic layer including: one or more first layers having a first refractive index ($n_1$) and a first thickness substantially equal to $\lambda/(4*n_1)$; and one or more second layers having a second refractive index ($n_2$) and a second thickness substantially equal to $\lambda/(4*n_2)$; and a color conversion layer disposed on the encapsulation layer, the color conversion layer including quantum dot layer configured to receive the light of wavelength λ and generate a light having a first color, wherein the second refractive index is smaller than the first refractive index, and wherein the one or more first layers and the one or more second layers are alternatingly stacked on one another.

The color conversion layer may further include a color filter layer disposed on the quantum dot layer, the color filter layer configured to transmit light having a first color and reflect light having other colors.

The color conversion layer may include: a first quantum dots area including a plurality of red quantum dots; a second quantum dots area including a plurality of green quantum dots; and a third quantum dots area free of the plurality of red quantum dots and the plurality of green quantum dots, wherein the plurality of red quantum dots is configured to convert light having a wavelength less than a wavelength of red light to the red light, and the plurality of green quantum dots is configured to convert light having a wavelength less than a wavelength of green light to the green light.

The color conversion layer may further include a first black matrix disposed between the first, second, and third quantum dots areas.

According to one aspect of the invention, a method of providing constructive interference in an encapsulation layer of an OLED, the encapsulation layer including a first inorganic layer having a first refractive index ($n_1$) and a second inorganic layer having a second refractive index ($n_2$), the method may include: depositing the first inorganic layer of the encapsulation layer directly on the OLED to a first thickness substantially equal to $\lambda/(4*n_1)$; and depositing the second inorganic layer of the encapsulation layer disposed directly on the OLED to a second thickness substantially equal to $\lambda/(4*n_2)$.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
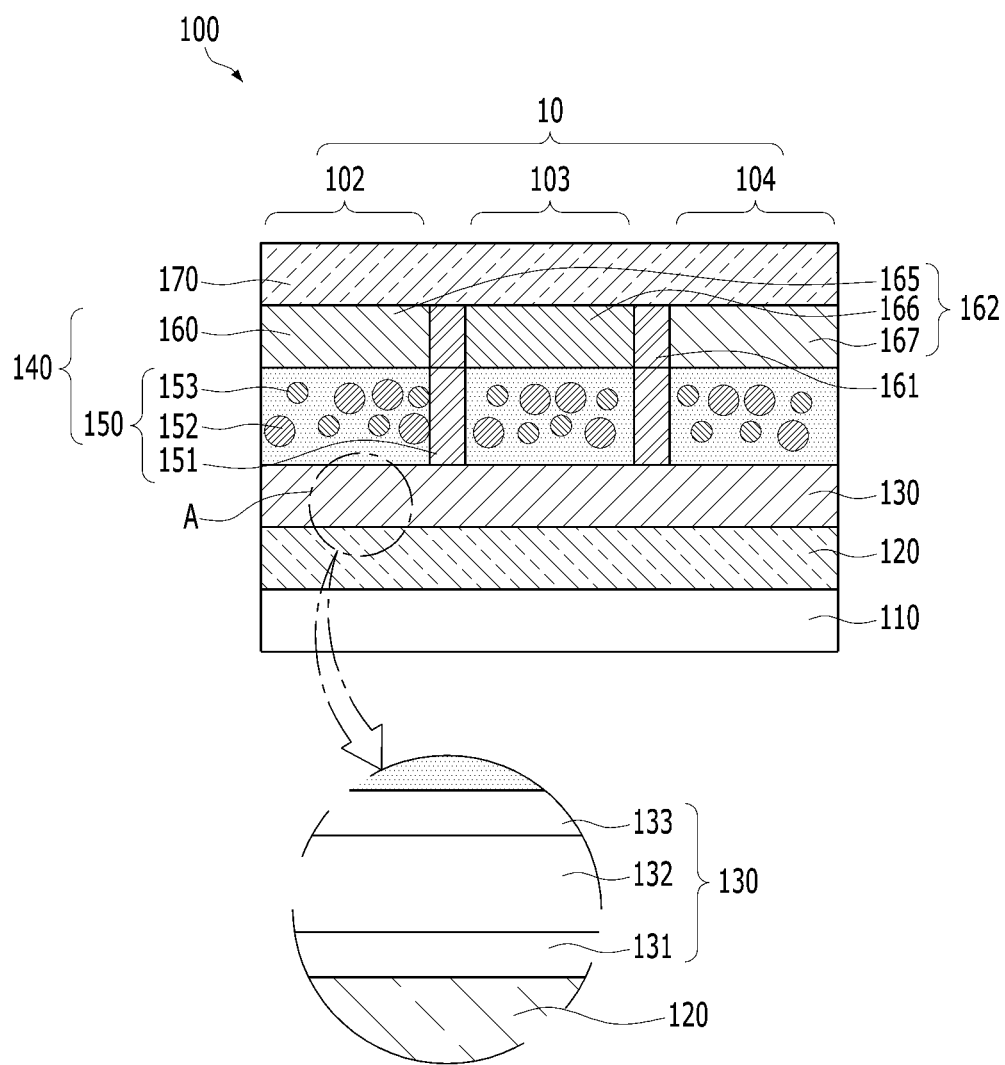
FIG. 1 is a cross-sectional drawing of an exemplary OLED display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to plan and/or sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have round or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional drawing illustrating a OLED display constructed according to the principles of the invention. FIG. 1 illustrates one pixel area 10 for descriptive purpose. OLED display 100 may display an image using a full range of visual color.

According to FIG. 1, the OLED display 100 includes a first substrate 110, a second substrate 170 disposed opposing to the first substrate 110, an Organic Light Emitting Device (OLED) layer 120, an encapsulation layer 130, and a color conversion layer 140. The OLED display 100 defines a number of pixel areas 10. Each pixel area 10 includes a first sub-pixel 102, a second sub-pixel 103, and a third sub-pixel 104. The first sub-pixel 102, the second sub-pixel 103, and the third sub-pixel 104 respectively emit light with different colors.

The first substrate 110 may be a flexible substrate, and may include plastic having improved heat-resistant and durability. For example, the first substrate 110 may include at least one material of polyethersulphone (PES), polyacrylate (PAR), polyetherimide (PEI), polyethyelenen napthalate (PEN), polyethyeleneterepthalate (PET), polyphenylene sulfide (PPS), polyallylate, PI (polyimide), polycarbonate (PC), cellulosetriacetate, cellulose acetate propionate (CAP), (poly(aryleneether sulfone) and a combination thereof. The material included in the first substrate 110 may be decided considering at least one criteria including structural strength, thermal stability, transparency, surface smoothness, ease of handling, and water resistance. However, the exemplary embodiments are not necessarily limited thereto, and the first substrate 110 may include various materials including metal and/or glass.

The OLED display 100 may further include layers including driving elements and signal lines. The driving elements and signal lines may include driving thin film transistors (TFT), switching TFTs, capacitor, and the signal lines connected to the driving TFT, switching TFT, and the capacitor. The OLED may also include a lithium fluoride layer as a protection layer.

The OLED display 100 includes organic light emitting diode OLED layer 120 disposed on the first substrate 110, and the OLEDs are configured to emit a monochrome light. In this embodiment, the OLED layer 120 include an array of OLEDs. The OLED array substrate includes a number of thin film transistors to control the OLEDS corresponding to the sub-pixels 102, 103, and 104 to emit a blue light.

The encapsulation layer 130 is disposed on the OLED layer 120 covering the OLED layer 120. The encapsulation layer 130 is disposed to seal the first substrate 110 and the OLED layer 120. The encapsulation layer 130 is configured to seal the OLED layer 120, and the encapsulation layer 130 protects the OLED layer 120 from deterioration from moisture and oxygen permeated from the external environment.

Referring to the region A of FIG. 1, the encapsulation layer 130 may have a multi-layer structure. More specifically, the encapsulation layer 130 includes a first inorganic layer 131, an organic layer 132, and the second inorganic layer 133 sequentially disposed on the OLED layer 120. The first inorganic layer 131 is disposed on the organic layer 132, the organic layer 132 is disposed on the first inorganic layer 131, and the second inorganic layer 133 is disposed on the organic layer 132. Accordingly, the organic layer 132 is interposed between the first inorganic layer 131 and the second inorganic layer 133.

The color conversion layer 140 is set between the encapsulation layer 130 and the second substrate 170. The color conversion layer 140 receives the blue light from the OLED layer 120 and converts the blue light to a light having a different color. In this embodiment, the OLED display 100 employs three-primary colors light to display the full color image. The first sub-pixel 102 emits a red light. The second sub-pixel 103 emits a green light. The third sub-pixel 104 emits a blue light.

The color conversion layer 140 includes a quantum dots layer 150 and a color filter 160. The quantum dots layer 150 is formed on the encapsulation layer 130 to receive the light emitted by the OLED layer 120. The color filter 160 is formed on a side of the quantum dots layer 150 opposite to the encapsulation layer 130.

The quantum dots layer 150 includes a first black matrix 151, a plurality of red quantum dots 152, and a plurality of green quantum dots 153. The quantum dots layer 150 includes a plurality of quantum dots units disposed respectively corresponding to the first sub-pixel 102, the second sub-pixel 103, and the third sub-pixel 104, each of the plurality of quantum dots units divided by the first black matrix 151. The red quantum dots 152 and the green quantum dots 153 are doped into each unit of the quantum dots layer 150. The red quantum dots 152 converts the light having a wavelength less than a wavelength of red light to red light. The green quantum dots 153 converts the light having a wavelength less than a wavelength of green light to green light. In this embodiment, the red quantum dots 152 convert the blue light to red light. The green quantum dots 153 convert the blue light to green light. Thus, red light converted by the red quantum dots 152, green light converted by the green quantum dots 153, and a remaining part of the blue light are mixed as a white light coming out of the quantum dots layer 150.

The color filter 160 includes a second black matrix 161 and a plurality of color layer 162. The plurality of color layer 162 includes a red filter 165, a green filter 166, and a blue filter 167 disposed corresponding to the first sub-pixel 102, the second sub-pixel 103, and the third sub-pixel 104. The red filter 165, the green filter 166, and the blue filter 167 are also aligned with each of the plurality of quantum dots units of the quantum dots layer 150. The red filter 165 emits red light by filtering green light and the blue light of the white light generated by the quantum dots layer 150. The green filter 166 emits green light by filtering red light and the blue light of the white light generated by the quantum dots layer 150. The blue filter 167 emits the blue light by filtering red light and green light of the white light generated by the quantum dots layer 150.

Figure 2:
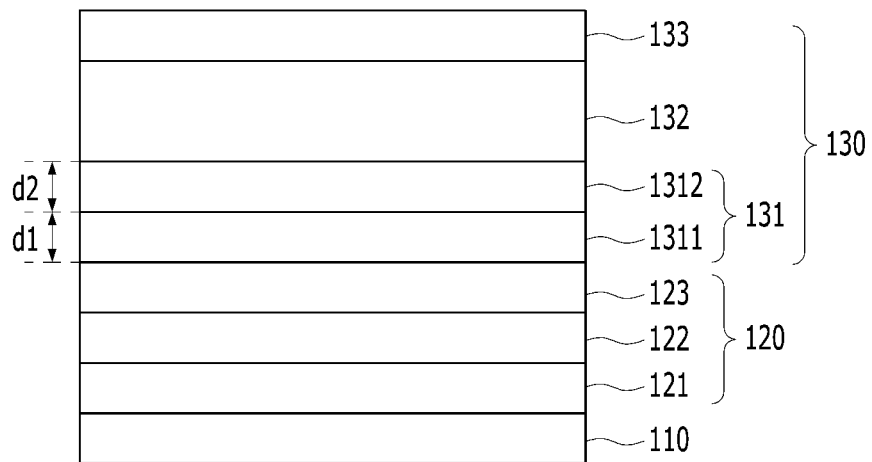
FIGS. 2, 3, and 4 are cross-sectional drawings of a part of OLED display devices according to exemplary embodiments.

FIG. 2 is a cross-sectional drawing of a part of OLED display device 100 according to an exemplary embodiment.

Referring to FIGS. 1 and 2, the OLED display device 100 according to the exemplary embodiment may include the OLED layer 120 disposed on the first substrate 110, a first electrode 121, an intermediate layer 122 disposed on the first electrode 121, the intermediate layer 122 including an emission layer, and a second electrode disposed on the intermediate layer 122.

the first electrode 121 may be a pixel electrode and may function as an anode, and the first electrode 121 may have a pattern corresponding to a plurality of sub-pixels including the first sub-pixel, the second sub-pixel, and the third sub-pixel. The first electrode 121 may be a reflective electrode including an reflective layer including, for example, silver Ag, magnesium Mg, aluminum Al, platinum Pt, palladium Pd, gold Au, nickel Ni, neodymium Nd, iridium Ir, chromium Cr, and compounds there of, and at least one layer of Indium tin oxide ITO, indium zinc oxide IZO, zinc oxide ZnO, and indium (III) oxide $In_2O_3$ disposed on the reflective layer.

The intermediate layer 122 includes an organic emission layer including organic material configured to emit a blue light. The organic emission layer may include a low molecular weight organic compounds and/or high molecular weight organic compounds. The intermediate layer 122 may selectively include, a hole transport layer HTL, a hole injection layer HIL, an electron transport layer ETL, and an electron injection layer EIL, dependent on the organic compound included in the organic emission layer. For example, if the organic emission layer includes the low molecular weight organic compounds, the hole transport layer HTL, the hole injection layer HIL, the electron transport layer ETL, and the electron injection layer EIL may be disposed on respective sides of the organic emission layer. If the organic emission layer includes the high molecular weight organic compounds, the intermediate layer 122 may further include the hole transport layer HTL.

the second electrode 123 may be a common layer and may function as a cathode, and the second electrode 123 may be optically transparent. The second electrode 123 may include a thin film layer having a low work function, which may include, for example, lithium Li, calcium Ca, lithium fluoride/calcium LiF/Ca, lithium fluoride/aluminum LiF/Al, aluminum Al, silver Ag, magnesium Mg, and compounds there of. The second electrode 123 may also include a transparent thin film including at least one of ITO, IZO, ZnO and $In_2O_3$.

According to the exemplary embodiment, the first electrode 121 may be the anode and the second electrode 123 may be the cathode, the exemplary embodiments are not limited thereto, and the first electrode 121 may be the cathode and the second electrode 123 may be anode, according to an operation of the OLED display 100. The first electrode 121 and the second electrode 123 may inject holes and electrons, respectively, into the organic light emission. The injected holes and electrons are combined to form excitons in an excited state. Light is generated when the excitons formed in the excited state falls to the ground state.

Referring to the region A of FIG. 1, the encapsulation layer 130 having the multi-layer structure includes the first inorganic layer 131, the organic layer 132, and the second inorganic layer 133 sequentially disposed on the OLED layer 120. The first inorganic layer 131 is disposed on the organic layer 132, the organic layer 132 is disposed on the first inorganic layer 131, the second inorganic layer 133 is disposed on the organic layer 132. Accordingly, the organic layer 132 is interposed between the first inorganic layer 131 and the second inorganic layer 133.

The first inorganic layer 131 may be configured to transmit a part of the radiated light and reflect the other part of the radiated light. More specifically, the first inorganic layer 131 may control the reflection rate for certain wavelength through distributed Bragg reflection DBR. The first inorganic layer 131 may include multiple inorganic layers having different refractive indexes alternatingly stacked.

The first inorganic layer 131 may have a multilayer structure including a high refractive index layer and a low refractive index layer alternatingly stacked. The first inorganic layer 131 may include a first layer 1311 and a second layer 1312. The first layer 1311 may have a first refraction rate, and the second layer 1312 may have a second refraction rate. The first refraction rate and the second refraction rate may be different from each other.

The first layer 1311 and the second layer 1312 may include silicon compounds, and may be disposed using an in-situ process, which may reduce the cost and the number of steps in the process. The first layer 1311 may include silicon nitride $SiN_X$ or silicon oxynitride SiON, and the second layer 1312 may include silicon oxide $SiO_X$.

The first inorganic layer 131 may be formed using Chemical Vapor Deposition CVD method. If the first layer 1311, the second layer 1312, and the third layer 1313 include silicon compounds, the first layer 1311, the second layer 1312, and the third layer 1313, may all be formed using the same precursor material, and therefore, manufacturing the first inorganic layer 131 may have improved efficiency. The first layer 1311, the second layer 1312, and the third layer 1313 may be formed using Plasma Enhanced CVD (PECVD). If the inorganic encapsulating layer is formed by sputtering, the second electrode 123 may be damaged, generating dark spots, and therefore, an organic capping layer and LiF layer should be disposed to protect the second electrode 123. On the other hand, according to the exemplary embodiment, the first inorganic layer 131 is formed using the SVD method, a damage to the second electrode 123 from forming the first inorganic layer 131 may be substantially reduced, and therefore, the encapsulation layer 130 including the first inorganic layer 131 may be formed on the second electrode 123 without disposing a protection layer, such as the capping layer and the LiF layer, on the second electrode 123.

The first refractive index may be greater than the second refractive index, and the first layer 1311 and the second layer 1312 may amplify the radiated blue light. A part of the blue light generated by the organic emission layer may directly transmit through the second electrode 123 and the encapsulation layer 130, and the other part of the blue light may be reflected due to the difference in the refractive index of the first layer 1311 and the second layer 1312 of the second electrode 123. The reflected blue light may be reflected back at the first electrode 121 and/or the second electrode 123. Accordingly, the generated blue light may resonate within the first inorganic layer 131 and the efficiency of the OLED display 100 may be improved.

For example, the first layer may be formed of silicon nitride $SiN_X$ which has a refractive index of substantially 2.1, and the second layer 1312 may be formed of silicon oxide $SiO_X$ which has a refractive index of substantially 1.4.

The first layer 1311 and the second layer 1312 may have a first thickness $d_1$ and a second thickness $d_2$. The first thickness $d_1$ and the second thickness $d_2$ may be based upon the wavelength $\lambda$, of the blue light generated from the organic emission layer, regardless of the first, second, or third sub-pixels 102, 103, and 104. For example, the first layer 1311 and the second layer 1312 may have the first thickness and the second thickness, respectively, selected according to the following formulas:

$$\text{The first thickness } d_1 = \lambda/(4 * n_1) \quad (1)$$

$$\text{The second thickness } d_2 = \lambda/(4 * n_2) \quad (2)$$

Where, $n_1$ represents the refractive index of the silicon nitride, $n_2$ represents the refractive index of the silicon oxide, and $\lambda$ represents the wavelength of blue light.

For example, when the blue light has a wavelength of 460 nm, the first thickness $d_1$ of the first layer 1311 and the second thickness $d_2$ of the second layer 1312 may be 55 nm and 80 nm, respectively.

The first layer 1311 and the second layer 1312 having the first thickness $d_1$ and the second thickness $d_2$ according to the above formulas (1) and (2), the blue light emitted from the OLED layer 120 may have improved efficiency, and therefore, the efficiency of the OLED display 100 may be improved.

According to the exemplary embodiment, the first inorganic layer 131 includes two layers of the first layer 1311 and the second layer 1312, but the exemplary embodiments are not limited thereto, and the first inorganic layer 131 may include N layers of the first layer 1311 and the second layer 1312, having different refractive indexes from each other, may be alternatingly stacked.

The organic layer 132 may be formed on the first inorganic layer 131. The organic layer 132 may include polymer material. The polymer material may include acrylic resin, epoxy resin, polyacrylate, polyurea, polyimide and polyethylene. The organic layer 132 may relieve the internal structural stress in the encapsulation layer 130, and compensate the surface defect and planarize the surfaces between the first inorganic layer 131 and the second.

The second inorganic layer 133 may be formed on the organic layer 132. The second inorganic layer 133 may include silicon nitride $SiN_X$, and the second inorganic layer 133 may be formed using the CVD method. The first inorganic layer 131 and the second inorganic layer 133 may function as barrier layers, and may reduce or prevent the moisture and oxygen permeated from the external environment. The second inorganic layer 133 may first provide protection against the permeating moisture and oxygen, and the first inorganic layer 131 may provide additional protection against the moisture and oxygen. According to the exemplary embodiment, the inorganic layers functioning as the barrier layer include two inorganic layers of the first inorganic layer 131 and the second inorganic layer 133, but the exemplary embodiments are not limited thereto, and number of the inorganic layers included in the barrier layer is not necessarily limited.

An inorganic buffer layer may be disposed on the second inorganic layer 133. The inorganic buffer layer may include an aluminum oxide layer, but the exemplary embodiments are not limited thereto. According to the exemplary embodiment, additional organic layer and protection layers may be interposed between the second inorganic layer 133 and the inorganic buffer layer.

The encapsulation layer 130 may protect the OLED layer 120 from against the moisture and oxygen permeating from the external environment. The encapsulation layer 130 may include an inorganic encapsulating layer as an outermost layer to improve the protection against the moisture and oxygen permeating from the external environment. The outermost layer of the encapsulation layer 130 may refer to one layer of a multiple layers included in the encapsulation layer 130 that is disposed farthest away from the OLED layer 120.

The encapsulation layer 130 may include an organic encapsulating layer interposed between the two inorganic encapsulating layers, to further improve the protection against the external moisture and increase the flexibility of the encapsulation layer 130. To improve the flexibility of the encapsulation layer may have greater thickness than the thickness of the inorganic layers.

Figure 3:
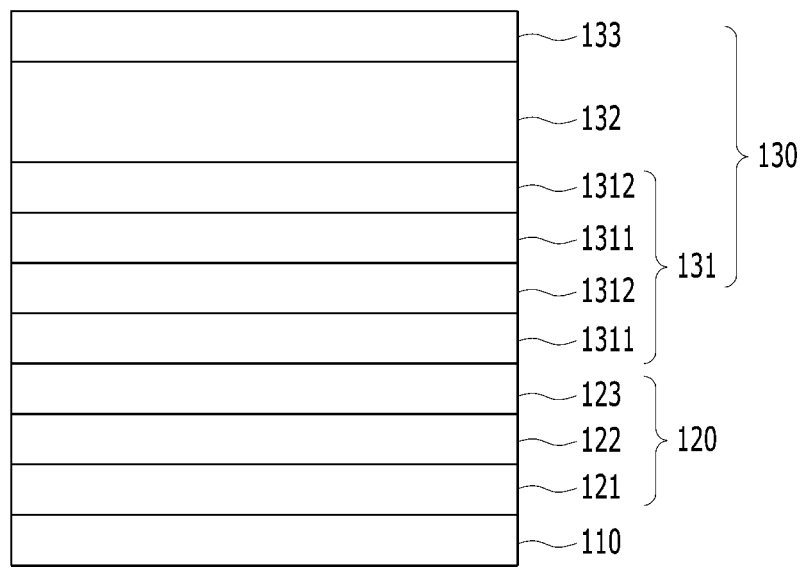

FIG. 3 is a cross-sectional drawing of a part of OLED display device according to exemplary embodiment.

Referring to FIG. 3, the first inorganic layer 131 may include more than one of the first layer 1311 and the second layer 1312. Accordingly, the first inorganic layer 131 may include 4 layers structure which includes the first layer 1311 and the second layer 1312 alternatingly stacked. The first layer 1311 has the first refractive index and the second layer has the second refractive index. The first refractive index and the second refractive index may be substantially different from each other.

The first layer 1311 and the second layer 1312 may include silicon compounds, and may be disposed using an in-situ process, which may reduce the cost and the number of steps in the process. The first layer 1311 may include silicon nitride $SiN_X$ or silicon oxynitride SiON, and the second layer 1312 may include silicon oxide $SiO_X$.

The first refractive index may be greater than the second refractive index, and the first layer 1311 and the second layer 1312 may amplify the radiated blue light. For example, the first layer may be formed of silicon nitride $SiN_X$ which has a refractive index of substantially 2.1, and the second layer 1312 may be formed of silicon oxide $SiO_X$ which has a refractive index of substantially 1.4.

The first thickness $d_1$ and the second thickness $d_2$ may be decided corresponding to the wavelength $\lambda$ of the blue light generated from the organic emission layer, regardless of the first, second, or third sub-pixels 102, 103, and 104. For example, the first layer 1311 and the second layer 1312 may have the first thickness and the second thickness, respectively, decided according to the following formulas:

$$\text{The first thickness } d_1 = \lambda/(4 * n_1) \quad (1)$$

$$\text{The second thickness } d_2 = \lambda/(4 * n_2) \quad (2)$$

Where, $n_1$ represents the refractive index of the silicon nitride, $n_2$ represents the refractive index of the silicon oxide, and $\lambda$ represents the wavelength of blue light.

The first layer 1311 and the second layer 1312 having the first thickness $d_1$ and the second thickness $d_2$ according to the above formulas (1) and (2), the blue light emitted from the OLED layer 120 may have improved efficiency, and therefore, the efficiency of the OLED display 100 may be improved.

According to the exemplary embodiment, the first inorganic layer 131 includes 4 layers of the first layer 1311 and the second layer 1312, but the exemplary embodiments are not limited thereto, and the first inorganic layer 131 may include N layers of the first layer 1311 and the second layer 1312, having different refractive indexes from each other, may be alternatingly stacked.

Figure 4:
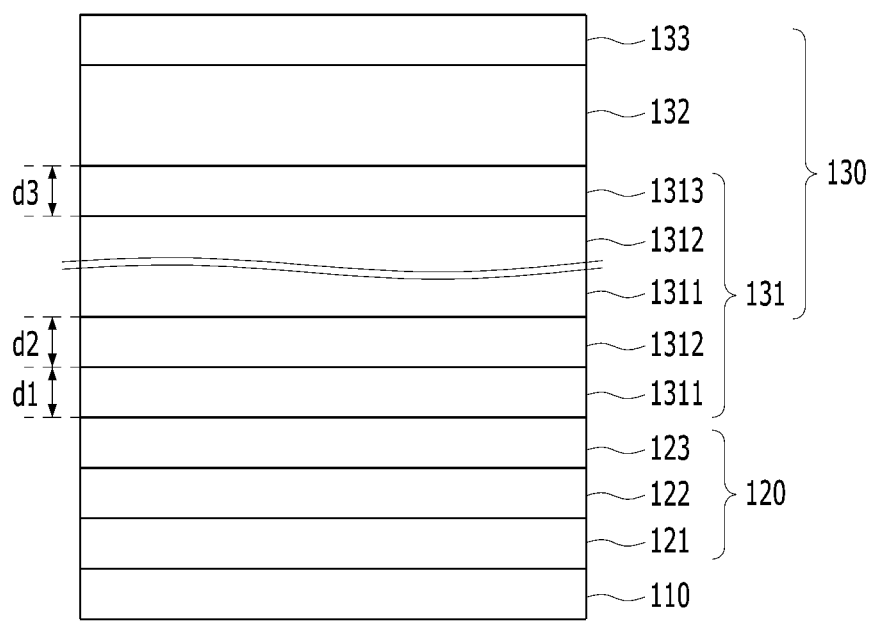

FIG. 4 is a cross-sectional drawing of a part of OLED display device according to exemplary embodiment.

Referring to FIG. 4, the first inorganic layer 131 may include the first layer 1311, the second layer 1312, and the third layer 1313, each having different refractive indexes from each other. For example, the first inorganic layer 131 may first include the first layer 1311 and the second layer 1312 alternatingly stacked, and the third layer 1313 may be disposed directly under the organic layer 132, which is disposed on the first inorganic layer 131. The first layer 1311 has the first refractive index, the second layer has the second refractive index, and the third layer 1313 has the third refractive index. The first refractive index, the second refractive index, and the third refractive index may be substantially different from each other.

the first inorganic layer 131 may be formed by the CVD method, and if the first layer 1311, the second layer 1312, and the third layer 1313 include silicon compounds, the first layer 1311, the second layer 1312, and the third layer 1313 may all be formed using the same precursor material, and therefore, manufacturing the first inorganic layer 131 may have improved efficiency.

The first refractive index and the third refractive index may be greater than the second refractive index, and the first layer 1311, the second layer 1312, and the third layer 1313 may amplify the radiated blue light. For example, the first layer may be formed of silicon nitride $SiN_x$, the second layer 1312 may be formed of silicon oxide $SiO_x$, and the third layer 1313 may be formed of silicon oxynitride $SiON_x$.

The first thickness $d_1$, the second thickness $d_2$, and the third thickness $d_3$ may be decided corresponding to the wavelength $\lambda$ of the blue light generated from the organic emission layer, regardless of the first, second, or third sub-pixels 102, 103, and 104. For example, the first layer 1311, the second layer 1312, and the third layer 1313 may have the first thickness, the second thickness, and the third thickness, respectively, selected according to the following formulas:

$$\text{The first thickness } d_1 = \lambda/(4*n_1) \quad (1)$$

$$\text{The second thickness } d_2 = \lambda/(4*n_2) \quad (2)$$

$$\text{The third thickness } d_3 = \lambda/(4*n_3) \quad (3)$$

Here, $n_1$ represents the refractive index of the silicon nitride, $n_2$ represents the refractive index of the silicon oxide, $n_3$ represents the refractive index of the silicon oxynitride and $\lambda$ represents the wavelength of the blue light.

The first layer 1311, the second layer 1312, and the third layer 1313 having the above first thickness $d_1$, the second thickness $d_2$, and the third thickness $d_3$ according to the above formulas (1), (2), and (3), the blue light emitted from the OLED layer 120 may have improved efficiency, and therefore, the efficiency of the OLED display 100 may be improved.

Figure 5A:
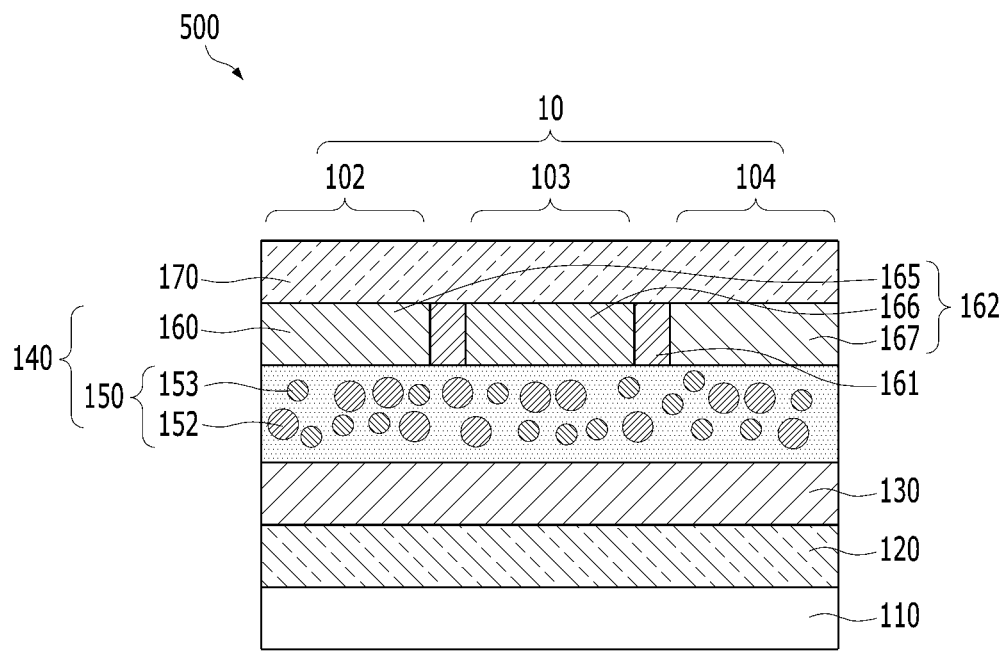
FIGS. 5A and 5B are cross-sectional drawings of additional exemplary embodiments of OLED display devices constructed according to the principles of the invention.
Figure 5B:
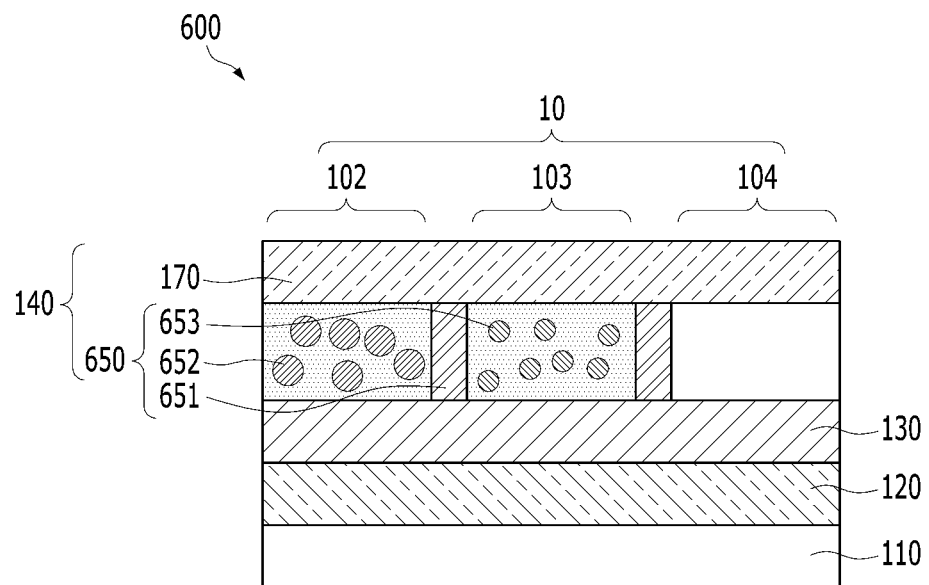

FIGS. 5A and 5B are cross-sectional drawings of additional exemplary embodiments of OLED display devices 500 and 600 according to exemplary embodiments of the inventive idea. The OLED display devices 500 and 600 are substantially identical with the OLED display device 100 illustrated in FIG. 1, except for the following descriptions.

Referring to FIG. 5A, the quantum dots layer 150 included in the OLED display device 500 does not include the first black matrix 151. In other words, the quantum dots layer 150 is formed continuously on the encapsulation layer 130, and a plurality of red quantum dots 152 and a plurality of green quantum dots 153 are included and evenly distributed in the quantum dots layer 150.

Referring to FIG. 5B, the OLED display device 600 does not include the color filter 160. Furthermore, the quantum dots layer 650 includes a first quantum dots area 652, a second quantum dots area 653, a third quantum dots area 654, and the first black matrix 151 is disposed between the first, second and third quantum dots area 652, 653, and 654. The first quantum dots area 652 may be disposed overlapping the first sub-pixel 102. The second quantum dots area 653 may be disposed overlapping the second sub-pixel 103. The third quantum dots area 654 may be disposed overlapping the third sub-pixel 104.

The first quantum dots area 652 may include the plurality of red quantum dots 152. The plurality of red quantum dots 152 converts light having a wavelength less than a wavelength of red light to red light. Accordingly, the first sub-pixel 102 may emit red light.

The second quantum dots area 653 may include the plurality of green quantum dots 153. The plurality of green quantum dots 153 converts the light having a wavelength less than a wavelength of green light to green light. Accordingly, the second sub-pixel 103 may emit green light.

The third quantum dots area 564 may not include the plurality of red and green quantum dots 152 and 153. Therefore, the blue light from the OLED layer 120 may be transmitted through the third quantum dots area 564 of the quantum dots layer 650. Accordingly, the third sub-pixel 104 may emit the blue light According to the exemplary embodiments, the OLED layer 120 may include the encapsulation layer 130 including multiple layers of inorganic layers having different refractive indexes and the OLED display 100 may have improved optical efficiency.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode (OLED) display, comprising:
    an OLED configured to emit a first color light;
    an encapsulation layer encapsulating the OLED, the encapsulation layer comprising a first inorganic layer disposed on the OLED, an organic layer disposed on the first inorganic layer, and a second inorganic layer disposed on the organic layer; and
    a conversion layer configured to receive the first color light from the OLED and convert the first color light to a light having a different color, the conversion layer comprising a quantum dots layer disposed on the encapsulation layer and a color filter layer disposed on the quantum dots layer,
wherein the first inorganic layer comprising:
a first layer having a first refractive index ($n_1$) and a first thickness, and
a second layer having a second refractive index ($n_2$) different from the first refractive index ($n_1$) and a second thickness different from the first thickness; and
wherein the quantum dots layer comprising:
a plurality of areas disposed respectively corresponding to a plurality of sub-pixels, and
a first black matrix disposed between the plurality of areas.

2. The OLED display of claim 1, wherein the second refractive index is smaller than the first refractive index.

3. The OLED display of claim 1, wherein the first thickness is substantially equal to $\lambda/(4*n_1)$, and the second thickness is substantially equal to $\lambda/(4*n_2)$, wherein $\lambda$ is a wavelength of the first color light.

4. The OLED display of claim 1, wherein the first layer comprises silicon nitride or silicon oxynitride; and
the second layer comprises silicon oxide.

5. The OLED display of claim 1, wherein the OLED comprises:
a substrate;
a first electrode disposed on the substrate;
an intermediate layer to generate the light disposed on the first electrode; and
a second electrode disposed on the intermediate layer.

6. The OLED display of claim 1, wherein the first inorganic layer further comprises:
a third layer having a third refractive index ($n_3$) different from the second refractive index and a third thickness different form the second thickness.

7. The OLED display of claim 6, wherein the third refractive index is greater than the second refractive index.

8. The OLED display of claim 6, wherein the third thickness is substantially equal to $\lambda/(4*n_3)$, wherein $\lambda$ is a wavelength of the first color light.

9. The OLED display of claim 6, wherein the third layer comprises silicon oxynitride.

10. The OLED display of claim 1, wherein the first color light has a monochromatic wavelength.

11. The OLED display of claim 10, wherein the wavelength of the first color light is within a blue spectrum.

12. The OLED display of claim 11, wherein at least one quantum dots unit comprises:
a plurality of red quantum dots to convert a blue light to a red light; and
a plurality of green quantum dots to convert the blue light to a green light.

13. The OLED display of claim 1, wherein the plurality of areas comprises:
a first area corresponding to a red sub-pixel and having a plurality of red quantum dots;
a second area corresponding to a green sub-pixel and having a plurality of green quantum dots; and
a third area corresponding to a blue sub-pixel and free of the plurality of red quantum dots and green quantum dots,
wherein the plurality of red quantum dots is configured to convert a light having a wavelength less than a wavelength of a red light to the red light, and the plurality of green quantum dots is configured to convert a light having a wavelength less than a wavelength of a green light to the green light.

14. The OLED display of claim 13, wherein the first black matrix is disposed between the first, second, and third areas.

15. An organic light emitting diode (OLED) display, comprising:
an OLED configured to emit a first color light of a wavelength $\lambda$, the wavelength $\lambda$ of the first color light being within a blue spectrum;
an encapsulation layer encapsulating the OLED, the encapsulation layer comprising a first inorganic layer disposed on the OLED, an organic layer disposed on the first inorganic layer, and a second inorganic layer disposed on the organic layer;
a quantum dots layer disposed on the encapsulation layer, the quantum dots layer comprising a plurality of areas disposed respectively corresponding to a plurality of sub-pixels, and a first black matrix disposed between the plurality of areas; and
a color filter layer disposed on the quantum dot layer,
wherein the first inorganic layer comprising:
a first layer having a first refractive index ($n_1$), and
a second layer having a second refractive index ($n_2$) different from the first refractive index ($n_1$); and
wherein the plurality of areas comprises:
a first area corresponding to a red sub-pixel and having a plurality of red quantum dots;
a second area corresponding to a green sub-pixel and having a plurality of green quantum dots; and
a third area corresponding to a blue sub-pixel and free of the plurality of red quantum dots and green quantum dots, and
the first black matrix is disposed between the first, second, and third areas.

16. The OLED display of claim 15, wherein the second refractive index is smaller than the first refractive index.

17. The OLED display of claim 15, wherein the first layer comprises silicon nitride or silicon oxynitride, and the second layer comprises silicon oxide.

18. The OLED display of claim 15, wherein the first inorganic layer further comprises:
a third layer having a third refractive index ($n_3$) different from the second refractive index.

19. The OLED display of claim 18, wherein the third refractive index is greater than the second refractive index.

20. The OLED display of claim 18, wherein the third layer comprises silicon oxynitride.

21. The OLED display of claim 15, wherein the plurality of red quantum dots is configured to convert a light having a wavelength less than a wavelength of a red light to the red light, and the plurality of green quantum dots is configured to convert a light having a wavelength less than a wavelength of a green light to the green light.

22. An organic light emitting diode (OLED) display, comprising:
an OLED configured to emit a first color light of a wavelength $\lambda$, the wavelength $\lambda$ of the first color light being within a blue spectrum;
an encapsulation layer encapsulating the OLED, the encapsulation layer comprising a first inorganic layer disposed on the OLED, an organic layer disposed on the first inorganic layer, and a second inorganic layer disposed on the organic layer;
a quantum dots layer disposed on the encapsulation layer, the quantum dots layer comprising a plurality of areas disposed respectively corresponding to a plurality of sub-pixels, and a first black matrix disposed between the plurality of areas; and a color filter layer disposed on the quantum dot layer, wherein the first inorganic layer comprising:

a first layer having a first thickness, and a second layer having a second thickness different from the first thickness; and wherein the plurality of areas comprises:

a first area corresponding to a red sub-pixel and having a plurality of red quantum dots;

a second area corresponding to a green sub-pixel and having a plurality of green quantum dots; and a third area corresponding to a blue sub-pixel and free of the plurality of red quantum dots and green quantum dots, and the first black matrix is disposed between the first, second, and third areas.

23. The OLED display of claim 22, wherein the first layer has a first refractive index ($n_1$) and the first thickness is substantially equal to $\lambda/(4*n_1)$.

24. The OLED display of claim 23, wherein the second layer has a second refractive index ($n_2$) smaller than the first refractive index and the second thickness is substantially equal to $\lambda/(4*n_2)$.

25. The OLED display of claim 22, wherein the first layer comprises silicon nitride or silicon oxynitride, and the second layer comprises silicon oxide.

26. The OLED display of claim 24, wherein the first inorganic layer further comprises:

a third layer having a third refractive index ($n_3$) different from the second refractive index and a third thickness different form the second thickness.

27. The OLED display of claim 26, wherein the third refractive index is greater than the second refractive index and the third thickness is substantially equal to $\lambda/(4*n_3)$.

28. The OLED display of claim 26, wherein the third layer comprises silicon oxynitride.

29. The OLED display of claim 22, wherein the plurality of red quantum dots is configured to convert light having a wavelength less than a wavelength of a red light to the red light, and the plurality of green quantum dots is configured to convert a light having a wavelength less than a wavelength of a green light to the green light.

* * * * *